(12) United States Patent
Qu

(10) Patent No.: US 6,916,430 B1
(45) Date of Patent: Jul. 12, 2005

(54) SUPERCONDUCTING HEAT TRANSFER MEDIUM

(75) Inventor: Yuzhi Qu, San Jose, CA (US)

(73) Assignee: New Qu Energy Ltd., Hong Kong (CN)

(*) Notice: Subject to any disclaimer, the term of this patent is extended or adjusted under 35 U.S.C. 154(b) by 381 days.

(21) Appl. No.: 09/657,985

(22) Filed: Sep. 8, 2000

Related U.S. Application Data
(60) Provisional application No. 60/036,043, filed on Jan. 27, 1997, and provisional application No. 60/029,266, filed on Oct. 25, 1996.

(30) Foreign Application Priority Data

Oct. 24, 1997 (WO) .............................. PCT/US97/18876

(51) Int. Cl.⁷ ................................................. C09K 5/00
(52) U.S. Cl. ............................. 252/71; 252/73; 252/74; 252/75; 252/78.1; 252/78.3
(58) Field of Search ............................. 252/71, 73, 74, 252/75, 78.1, 78.3

(56) References Cited

U.S. PATENT DOCUMENTS

| | | | |
|---|---|---|---|
| 4,590,993 A | | 5/1986 | Kurzweg |
| 4,857,675 A | * | 8/1989 | Marancik et al. .......... 174/15.4 |
| 5,450,266 A | * | 9/1995 | Downie ....................... 361/19 |
| 5,542,471 A | | 8/1996 | Dickinson |
| D425,611 S | | 5/2000 | Qu |
| 6,132,823 A | | 10/2000 | Qu |

FOREIGN PATENT DOCUMENTS

| | | |
|---|---|---|
| CN | 1051750 A | 5/1991 |
| EP | 303 493 | 8/1988 |
| EP | 0 303 493 | 8/1988 |
| WO | WO 98/19859 | 5/1998 |

* cited by examiner

Primary Examiner—Charles Boyer
Assistant Examiner—D G Hamlin
(74) Attorney, Agent, or Firm—Morrison & Foerster LLP

(57) ABSTRACT

This is a superconducting heat transfer medium which may be placed in a a conduit to rapidly and efficiently transfer heat.

10 Claims, 7 Drawing Sheets

SUPERCONDUCTING HEAT TRANSFER MEDIUM

RELATED APPLICATIONS

This application relies upon the following for priority under 35 USC 120 or 371: U.S. Provisional Applications Ser. Nos. 60/029,266, filed Oct. 25, 1996 and 60/036,043, filed Jan. 27, 1997; PCT US/18,876, filed Oct. 24, 1997; and U.S. patent applications Ser. No. 08/957,148, filed Oct. 24, 1997 and Ser. No. 09/437,659, filed Nov. 10, 1999, the latter of which are co-pending.

TECHNICAL FIELD

The present invention relates generally to the field of heat transfer. More particularly, the present invention relates to a superconducting heat transfer medium which is disposed within a conduit to rapidly and efficiently transfer heat.

BACKGROUND ART

Efficiently transporting heat from one location to another always has been a problem. Some applications, such as keeping a semiconductor chip cool, require rapid transfer and removal of heat, while other applications, such as dispersing heat from a furnace, require rapid transfer and retention of heat. Whether removing or retaining heat, the heat transfer conductivity of the material utilized limits the efficiency of the heat transfer. Further, when heat retention is desired, heat losses to the environment further reduce the efficiency of the heat transfer.

For example, it is well known to utilize a heat pipe for heat transfer. The heat pipe operates on the principle of transferring heat through mass transfer of a fluid carrier contained therein and phase change of the carrier from the liquid state to the vapor state within a closed circuit pipe. Heat is absorbed at one end of the pipe by vaporization of the carrier and released at the other end by condensation of the carrier vapor. Although the heat pipe improves thermal transfer efficiency as compared to solid metal rods, the heat pipe requires the circulatory flow of the liquid/vapor carrier and is limited by the association temperatures of vaporization and condensation of the carrier. As a result, the heat pipe's axial heat conductive speed is further limited by the amount of latent heat of liquid vaporization and on the speed of circular transformation between liquid and vapor states. Further, the heat pipe is convectional in nature and suffers from thermal losses, thereby reducing the thermal efficiency.

An improvement over the heat pipe, which is particularly useful with nuclear reactors, is described by Kurzweg in U.S. Pat. No. 4,590,993 for a Heat Transfer Device For The Transport Of Large Conduction Flux Without Net Mass Transfer. This device has a pair of fluid reservoirs for positioning at respective locations of differing temperatures between which it is desired to transfer heat. A plurality of ducts having walls of a material which conducts heat connect the fluid reservoirs. Heat transfer fluid, preferably a liquid metal such as mercury, liquid lithium or liquid sodium, fills the reservoirs and ducts. Oscillatory axial movement of the liquid metal is created by a piston or a diaphragm within one of the reservoirs so that the extent of fluid movement is less than the duct length. This movement functions to alternately displace fluid within the one reservoir such that the liquid metal is caused to move axially in one direction through the ducts, and then to in effect draw heat transfer fluid back into the one reservoir such that heat transfer fluid moves in the opposite direction within the ducts. Thus, within the ducts, fluid oscillates in alternate axial directions at a predetermined frequency and with a predetermined tidal displacement or amplitude. With this arrangement, large quantities of heat are transported axially along the ducts from the hotter reservoir and transferred into the walls of the ducts, provided the fluid is oscillated at sufficiently high frequency and with a sufficiently large tidal displacement. As the fluid oscillates in the return cycle to the hotter reservoir, cooler fluid from the opposite reservoir is pulled into the ducts and the heat then is transferred from the walls into the cooler fluid. Upon the subsequent oscillations, heat is transferred to the opposite reservoir from the hotter reservoir. However, as with the heat pipe, this device is limited in efficiency by the heat transfer conductivity of the materials comprising the reservoirs and ducts and by heat losses to the atmosphere.

It is known to utilize radiators and heat sinks, to remove excess heat generated in mechanical or electrical operations. Typically, a heat transferring fluid being circulated through a heat generating source absorbs some of the heat produced by the source. The fluid then is passed through tubes having heat exchange fins to absorb and radiate some of the heat carried by the fluid. Once cooled, the fluid is returned back to the heat generating source. Commonly, a fan is positioned to blow air over the fins so that energy from the heat sink radiates into the large volume of air passing over the fins. With this type of device, the efficiency of the heat transfer is again limited by the heat transfer conductivity of the materials comprising the radiator or the heat sink.

Dickinson in U.S. Pat. No. 5,542,471 describes a Heat Transfer Element Having Thermally Conductive Fibers that eliminates the need for heat transferring fluids. This device has longitudinally thermally conductive fibers extended between two substances that heat is to be transferred between in order to maximize heat transfer. The fibers are comprised of graphite fibers in an epoxy resin matrix graphite fibers cured from an organic matrix composite having graphite fibers in an organic resin matrix, graphite fibers in an aluminum matrix, graphite fibers in a copper matrix, or a ceramic matrix composite.

In my People's Republic of China Patent Number 89108521.1, I disclosed an Inorganic Medium Thermal Conductive Device. This heat conducting device greatly improved the heat conductive abilities of materials over their conventional state. Experimentation has shown this device capable of transferring heat along a sealed metal shell having a partial vacuum therein at a rate of 5,000 meters per second. On the internal wall of the shell is a coating applied in three steps having a total optimum thickness of 0.012 to 0.013 millimeters. Of the total weight of the coating, strontium comprises 1.25%, beryllium comprises 1.38%, and sodium comprises 1.95%. This heat conducting device does not contain a heat generating powder and does not transfer heat nor prevent heat losses to the atmosphere in a superconductive manner as the present invention.

BRIEF SUMMARY OF THE INVENTION

It is generally accepted that when two substances having different temperatures are brought together, the temperature of the warmer substance decreases and the temperature of the cooler substance increases. As the heat travels along a heat conducting conduit from a warm end to a cool end, available heat is lost due to the heat conducting capacity of the conduit material, the process of warming the cooler portions of the conduit and thermal losses to the atmosphere. In accordance with the present invention and these contemplated problems which continue to exist in this field, one objective of this invention is to provide a superconducting heat transfer medium that is environmentally sound, rapidly conducts heat and preserves heat, in a highly efficient manner. Further, the present invention does not require a tightly controlled process environment to produce.

Another object of this invention is to provide a device that conducts heat with a heat preservation efficiency approaching 100 percent.

Also, another object of this invention is to provide a method for denaturation of rhodium and radium carbonate.

Yet another objective of this invention is to provide a process for making a device that transfers heat from a heat source from one point to another without any effective heat loss.

Still yet, another object of this invention is to provide a heat sink utilizing the superconducting heat transfer medium that rapidly and efficiently disperses heat from a heat generating object.

This invention accomplishes the above and other objectives and overcomes the disadvantages of the prior art by providing a superconducting heat transfer medium that is relatively inexpensive to prepare, simple in design and application, and easy to use.

The medium is applied to the conduit in three basic layers. The first two layers are prepared from solutions which are exposed to the inner wall of the conduit. Initially, the first layer, which primarily comprises in ionic form various combinations of sodium, beryllium, a metal such as manganese or aluminum, calcium, boron, and dichromate radical, is absorbed into the inner wall of the conduit to a depth of 0.008 mm to 0.012 mm. Subsequently, the second layer, which primarily comprises in ionic form various combinations of cobalt, manganese, beryllium, strontium, rhodium, copper, β-titanium, potassium, boron, calcium, a metal such as aluminum and the dichromate radical, builds on top of the first layer and actually forms a film having a thickness of 0.008 mm to 0.012 mm over the inner wall of the conduit. Finally, the third layer is a powder comprising various combinations of rhodium oxide, potassium dichromate, radium oxide, sodium dichromate, silver dichromate, monocrystalline silicon, beryllium oxide, strontium chromate, boron oxide, β-titanium and a metal dichromate, such as manganese dichromate or aluminum dichromate, that evenly distributes itself across the inner wall. The three layers can be applied to a conduit and then heat polarized to form a superconducting heat transfer device that transfers heat without any net heat loss, or can be applied to a pair of plates having a small cavity relative to a large surface area to form a heat sink that can immediately disperse heat from a heat source.

It is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

Other objects, advantages and capabilities of the invention will become apparent from the following description taken in conjunction with the accompanying drawings showing the preferred embodiment of the invention.

BRIEF DESCRIPTION OF THE DRAWINGS

The invention will be better understood and the above objects as will as objects other than those set forth above will become apparent when consideration is given to the following detailed description thereof Such description makes reference to the annexed drawings wherein.

DETAILED DESCRIPTION OF THE PREFERRED EMBODIMENTS

Figure 1:
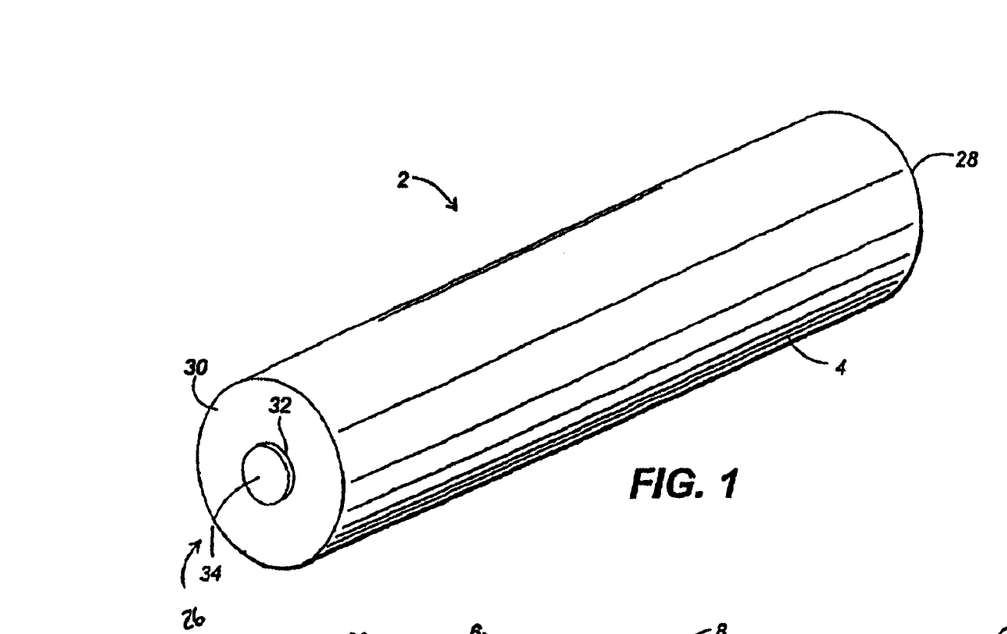
FIG. 1 is a perspective view of a superconducting heat transfer device made in accordance with the present invention.
Figure 2:
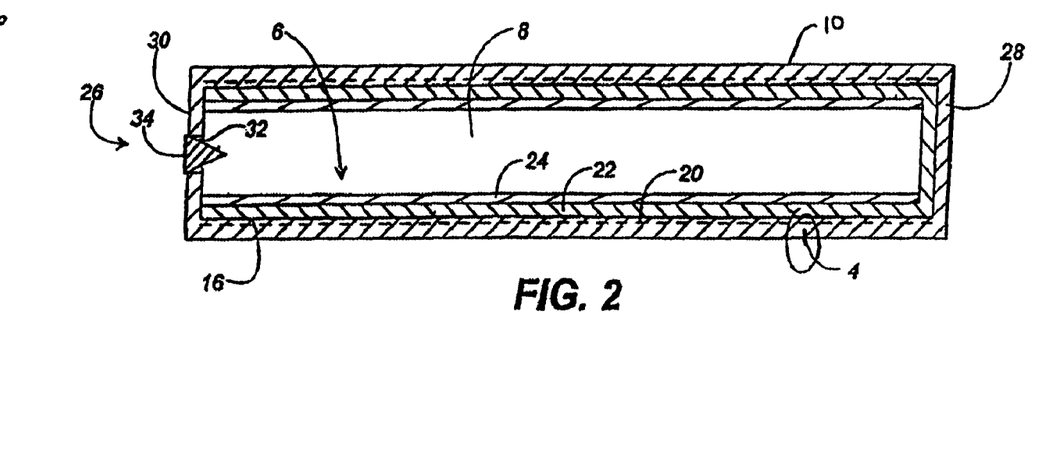
FIG. 2 is a cross-sectional view of the device of FIG. 1.

For a fuller understanding of the nature and desired objects of this invention, reference should be made to the following detailed description taken in connection with the accompanying drawings. Referring to the drawings, wherein like reference numerals designate corresponding parts throughout the several figures, reference is made first to FIGS. 1 and 2. A superconducting heat transfer device 2 comprising a carrier such as conduit 4 containing a superconducting heat transfer medium 6 is provided which can be placed within a cavity 8 of the conduit 4 without regard to the material comprising the conduit 4. While the conduit 4 shown in FIG. 1 is cylindrical in shape, the present invention envisions conduits in a variety of shapes and sizes. The resulting heat transfer capabilities of the medium 6 bearing conduit 4 are greatly enhanced without any subsequent thermal loss. If properly applied within conduit 4, medium 6 actually is catalyzed by heat to become a heat generator itself. Medium 6 is activated at a temperature of about 38° C. and can operate to a maximum temperature of about 1730° C. Although not completely certain, it is believed that the thermal generating capability of medium 6 is directly related to mass loss of medium 6 after activation. Because medium 6 is capable of immediately transferring heat through conduit 4 from a heat source (not shown), conduit 4 can be exposed to and operate within an environment having a source temperature far in excess of the melting temperature of the untreated material comprising conduit 4.

Figure 4:
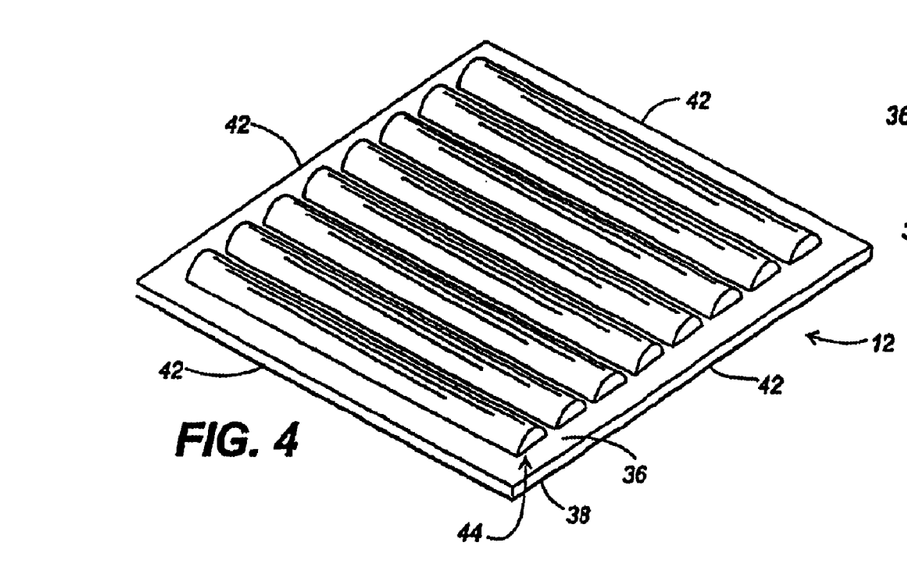
FIG. 4 is a perspective view of a heat sink made in accordance with the present invention.
Figure 5:
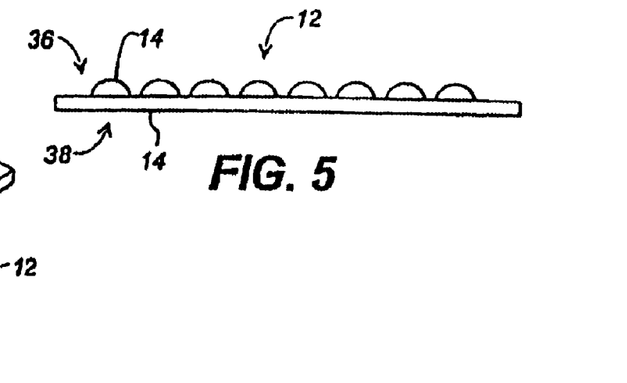
FIG. 5 is a side elevation view of the heat sink of FIG. 4.
Figure 6:
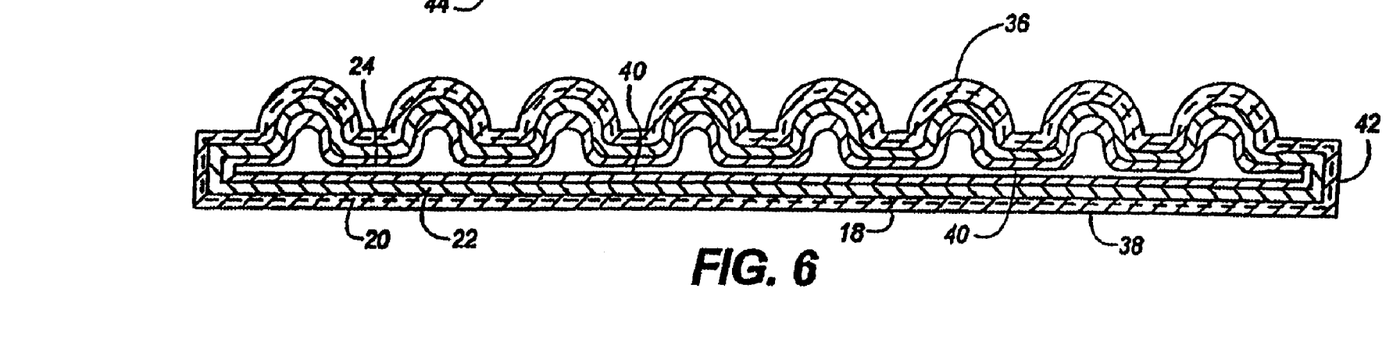
FIG. 6 is a cross-sectional view of the heat sink of FIG. 4.

It is additionally believed that during the initial stages of medium 6 activation, medium 6 reacts endothermically. As a result, medium 6 can immediately absorb available heat from the heat source and thereafter immediately transfer the heat throughout conduit 4. If the cubic volume of cavity 8 is small in relation to external surface 10 area of conduit 4, as shown in FIGS. 4 through 6, medium 6 absorbs heat to provide a heat sink 12 which immediately removes heat from the heat generating source. Heat radiation is directly related to heat capacity, the rate of heat conduction, and thermal conductivity. This, in other words, determines the speed (rate) at which the volume (quantity) of heat can be transferred in each unit volume.

If conduit 4 or carrier has a small cavity in relation to a large external surface 10 area, the carrier is more capable of distributing heat across the external surface 10. In applications where the temperature of the heat generating source does not exceed 38° C., the medium 6 activation temperature, the heat is immediately absorbed and dispersed by medium 6. In cases where the heat generating source exceeds 38° C., heat sink 12 is still highly effective because of the ability of medium 6 to rapidly transfer the heat to heat sink external surface 14 and be efficiently dispersed to the atmosphere by thermal radiation.

Medium 6 is applied in three basic layers, the first two of which are prepared from solutions. Each solution is exposed sequentially to an inner conduit surface 16 or an inner heat sink surface 18. Initially, first layer 20 is absorbed into inner conduit surface 16 or heat sink surface 18. Subsequently, second layer 22 builds on top of first layer 20 and actually forms a film over inner conduit surface 16 or heat sink surface 18. Finally, third layer 24 is a powder that evenly distributes itself across inner conduit surface 16 or heat sink surface 18. Although reference is made to conduit 4 below in the discussion of medium 6, the application of medium 6 within heat sink 12 is the same.

First layer 20 is an anti-corrosion layer which prevents etching of inner conduit surface 16 and, in theory, causes a realignment of the atomic structure of conduit 4 material so that heat is more readily absorbed. A further function of first layer 20 is to prevent inner conduit surface 16 from producing oxides. For example, ferrous metals can be easily oxidized when exposed to water molecules contained in the air. The oxidation of inner conduit surface 16 will cause corrosion and also create a heat resistance. As a result, there is an increased heat load while heat energy is transferred within conduit 4, thus causing an accumulation of heat energy inside conduit 4. Should this occur, the life span of medium 6 is decreased.

Next, second layer 22, the active layer, prevents the production of elemental hydrogen and oxygen, thus restraining oxidation between oxygen atoms and the material of conduit 4 (or carrier). Also in theory, second layer 22 conducts heat across inner conduit surface 16 comparably to that of electricity being conducted along a wire. Experimentation has found that heat can be conducted by medium 6 at a rate of 15,000 meters per second, regardless of the heat conductivity coefficient of the material of the conduit. Second layer 22 also assists in accelerating molecular oscillation and friction associated with third layer 24 to provide a heat transfer pathway for heat conduction.

Third layer 24 is referred to, due to its color and appearance, as the "black powder" layer. It is believed third layer 24 generates heat once medium 6 is exposed to the minimum activation temperature of 38° C. Upon activation of medium 6, the atoms of third layer 24, in concert with first layer 20 and second layer 22, begin to oscillate. As the heat source temperature increases, it is believed that frequency of oscillation increases. It is believed that when the activating temperature reaches 200° C., the frequency of oscillation is 230 million times per second, and when the activating temperature is higher than 350° C., the frequency can even reach 280 million times per second. Theoretically, the higher the activating temperature, the higher the frequency of oscillation. Therefore it is suspected that the higher the load, the higher the performance efficiency of the conduit. During the heat transfer process, there is neither phase transition nor mass transfer of medium 6. Experimentation has shown that a steel conduit 4 with medium 6 properly disposed therein has a thermal conductivity that is generally 20,000 times higher than the thermal conductivity of silver, and can reach under laboratory conditions a thermal conductivity that is 30,000 times higher that the thermal conductivity of silver.

During use, after activation, medium 6 loses mass with use (decay caused by the conversion of mass into energy). As a result, medium 6 has a long, but limited useful life. Tests have shown that after 10,000 hours of continuous use, both the amount of medium 6 and the molecule vibration frequency remain the same as from the initial activation. However, at 120,000 hours of continuous use, the amount (mass) of medium 6 starts to decline at a rate of about 0.5% every 32 hours with the molecule vibration frequency significantly decreased by about 6%. After about 123,200 hours of continuous use, medium 6 became ineffective. It is believed that the aging is caused mainly by the decay, or conversion of mass into energy, of third layer 24. As is expected, lower working temperatures slow the decay of third layer 24. First layer 20 and second layer 22 have been determined to be used up at a rate of approximately 0.001 mm per 10,000 hours of use.

To prepare first layer 20, a first layer solution is manufactured and thereafter applied to inner conduit surface 16. A representative first layer solution is manufactured by the following steps, preferably conducted in the order of listing:

(a) placing 100 ml of distilled water into an inert container such as glass or, preferably, ceramic;

(b) dissolving and mixing between 2.0 and 5.0 grams of sodium peroxide into the water;

(c) dissolving and mixing between 0.0 and 0.5 grams of sodium oxide into the solution of step (b);

(d) dissolving and mixing between 0.0 and 0.5 grams of beryllium oxide into the solution of step (c);

(e) dissolving and mixing between 0.3 and 2.0 grams of a metal dichromate such as aluminum dichromate or, preferably, magnesium dichromate into the solution of step (d);

(f) dissolving and mixing between 0.0 and 3.5 grams of calcium dichromate into the solution of step (e); and (g) dissolving and mixing between 1.0 and 3.0 grams of boron oxide into the solution of step (f) to form the first layer solution.

It is preferred for steps (a) through (g) to be conducted in the order listed and under conditions having a temperature between 0° C. and 30° C., preferably 5° C. to 8° C., and a relative humidity of no greater that 40%. The steps for the addition of beryllium oxide and the metal dichromate can be reversed in order so that the metal dichromate is added to the first layer solution prior to the addition of beryllium oxide without causing negative effects. When medium 6 contains manganese sesquioxide, rhodium oxide or radium oxide, either sodium peroxide or sodium oxide may be eliminated, but the resulting heat transfer efficiency of medium 6 will be lower and the life span of medium 6 will be reduced by approximately 1 year. As to the remaining components of the first layer solution and subject to the above exceptions, each component should be added in the order presented. If the components of the first layer solution are combined in an order not consistent with the listed sequence, the solution can become unstable and may result in a catastrophic reaction.

Prior to manufacturing a solution for second layer 22 and compiling the compounds for third layer 24, rhodium and radium carbonate undergo a denaturation process. To denature 100 grams of rhodium powder, blend 2 grams of pure lead powder with the rhodium powder within a container and subsequently place the container with the rhodium and lead powders into an oven at a temperature of 850° C. to 900° C. for at least 4 hours to form rhodium oxide. Then separate the rhodium oxide from the lead. To denature 100 gram of radium carbonate powder, blend 11 grams of pure lead powder with the radium carbonate within a container and subsequently place the container with the radium carbonate and lead powders into an oven at a temperature of 750° C. to 800° C. for at least eight hours to form radium oxide. During experimentation, a platinum container was utilized in the denaturation process. The material comprising the container should be inert with respect to rhodium, rhodium oxide, radium carbonate, radium oxide, and lead. Lead utilized in the denaturation process preferably should be 99.9% pure and can be recycled for subsequent use in further like denaturation processes. Subsequent testing of medium 6 at a resting state and an active state with a PDM personal dosimeter resulted in no radioactive emissions of any kind detectable over background radiation.

An isotope of titanium is utilized in medium 6. In some countries the isotope is known as B-type titanium, and in the United States of America, the isotope is known as β-titanium.

Second layer 22 is derived from a solution that is applied to inner conduit surface 16 over first layer 20. Similar to the first layer solution, a representative second layer solution is manufactured by the following steps, conducted preferably in the order of listing:

(a) placing 100 ml of twice-distilled water into an inert container such as glass or, preferably, ceramic;

(b) dissolving and mixing between 0.2 and 0.5 grams of cobaltous, oxide into the twice-distilled water;

(c) dissolving and mixing between 0.0 and 0.5 grams of manganese sesquioxide into the solution of step (b);

(d) dissolving and mixing between 0.0 and 0.01 grams of beryllium oxide into the solution of step (c);

(e) dissolving and mixing between 0.0 and 0.5 grams of strontium chromate into the solution of step (d);

(f) dissolving and mixing between 0.0 and 0.5 grams of strontium carbonate into the solution of step (e);

(g) dissolving and mixing between 0.0 and 0.2 grams of rhodium oxide into the solution of step (f);

(h) dissolving and mixing between 0.0 and 0.8 grams of cupric oxide into the solution of step (g);

(i) dissolving and mixing between 0.0 and 0.6 grams of β-titanium. into the solution of step (h);

(j) dissolving and mixing between 1.0 and 1.2 gram of potassium dichromate into the solution of step (i);

(k) dissolving and mixing between 0.0 and 1.0 gram of boron oxide into the solution of step (j);

(l) dissolving and mixing between 0.0 and 1.0 grams of calcium dichromate into the solution of step (k); and (m) dissolving and mixing between 0.0 and 2.0 grams of aluminum dichromate or, preferably, magnesium dichromate, into the solution of step (l) to form the second layer solution.

It is preferred for the twice-distilled water to have an electrical conductivity that approaches 0. The higher the electrical conductivity, the greater the problem of static electricity interfering with medium 6 and causing a reduction in the thermal conductive efficiency. The steps of (a) through (m) preferably are conducted under conditions having a temperature between 0° C. and 30° C. and a relative humidity of no greater than 40%. When medium 6 contains rhodium oxide or radium oxide, the amount of manganese sesquioxide may be reduced or eliminated; however, the life span of medium 6 will be reduced and the thermal conductive efficiency will be reduced by approximately 0.2%, Generally, β-titanium may be added to the second layer solution at any step listed above, except that it should not be added to the twice-distilled water at step (b) or as the last component of the solution. Adding β-titanium at step (b) or as the last component of the solution can cause instability of the second layer solution. The steps for adding manganese sesquioxide and beryllium oxide may. be reversed in order so that beryllium oxide is added to the second layer solution prior to the addition of manganese sesquioxide. Likewise, the steps for adding potassium dichromate and calcium dichromate may be reversed in order so that calcium dichromate is added to the second layer solution prior to the addition of potassium dichromate. If the components of the second layer solution are combined in an order not consistent with the listed sequence and the exceptions noted above, the solution can become unstable and may result in a catastrophic reaction.

Prior to preparing third layer 24, silicon is treated by magnetic penetration. Monocrystalline silicon powder having a preferred purity of 99.999% is placed within a nonmagnetic container and disposed within a magnetic resonator for at least 37 minutes, preferably 40 minutes to 45 minutes. The magnetic resonator utilized during experimentation was a 0.5 kilowatt, 220 volt and 50 hertz magnetic resonator. If the silicon being used has a purity lower than 99.999%, the amount of silicon needed in third layer 24 increases. The magnetic resonator is used to increase the atomic electron layer of the silicon, which in turn, increases the speed that heat is conducted by medium 6.

A representative powder of third layer 24 is manufactured by the following steps, conducted preferably in the order of listing:

(a) placing between 0.0 and 1.75 gram of denatured rhodium oxide into an inert container such as glass or, preferably, ceramic;

(b) blending between 0.3 and 2.6 grams of sodium dichromate with the rhodium oxide;

(c) blending between 0.0 and 0.8 grams of potassium dichromate with the mixture of step (b);

(d) blending between 0.0 and 3.1 grams of denatured radium oxide with the mixture of step (c);

(e) blending between 0.1 and 0.4 gram of silver dichromate with the mixture of step (d);

(f) blending between 0.2 and 0.9 grams of the monocrystalline silicon powder treated by magnetic penetration with the mixture of step (e);

(g) blending between 0.0 and 0.01 grams of beryllium oxide with the mixture of step (f);

(h) blending between 0.0 and 0.1 gram of strontium chromate with the mixture of step (g);

(i) blending between 0.0 and 0.1 grams of boron oxide with the mixture of step (h);

(j) blending between 0.0 and 0.1 gram of sodium peroxide with the mixture of step (i);

(k) blending between 0.0 and 1.25 grams of β-titanium with the mixture of step (j); and (l) blending between 0.0 and 0.2 grams of aluminum dichromate or, preferably, magnesium dichromate, into the mixture of step (k) to form the third layer powder.

The powder for third layer 24 preferably should be blended at a temperature lower than about 25° C. By blending at lower temperatures, the heat conducting efficiency of medium 6 improves. Further, the relative humidity should be below 40%. It is preferred for the relative humidity to be between 30% and 35%. Generally, radium oxide and β-titanium may be added to the powder of third layer 24 at any step listed above, except that neither one should be added to the powder as the first or last component. Adding either radium oxide or β-titanium as the first or last component of the powder can cause instability of medium 6 and may result in a catastrophic reaction. The steps for adding potassium dichromate and silver dichromate may be reversed in order so that silver dichromate is added to the powder of third layer 24 prior to the addition of potassium dichromate. Likewise, the steps for adding strontium chromate and beryllium oxide may be reversed in order so that beryllium oxide is added to the powder of third layer 24 prior to the addition of strontium chromate. If the components of the powder of third layer 24 are combined in an order not consistent with the listed sequence and the exceptions noted above, medium 6 can become unstable and may result in a catastrophic reaction.

The powder of third layer 24 may be stored for prolonged periods of time. To prevent degradation by light and humidity, the powder of third layer 24 should be stored in a dark, hermetic storage container made from an inert material preferably glass. A moisture absorbing material also may be placed within the storage container so long as the moisture absorbing material is inert to and is not intermingled with the powder of third layer 24.

Once the solutions for first layer 20 and second layer 22 and the powder of third layer 24 are prepared, the superconducting heat transfer device 2 can be fabricated. Conduit 4 can be any one of a variety of metallic or non-metallic materials; and in any event, should have very little oxidation, preferably no oxidation, on inner conduit surface 16. It is recommended for conduit 4, particularly if conduit 4 is manufactured of a metal, to be clean, dry and free of any oxides or oxates. This can be accomplished by convectional treating by, for example, sand blasting, weak acid washing, or weak base washing. Any materials used to clean and treat conduit 4 should be completely removed and inner conduit surface 16 also should be dry prior to adding medium 6 to conduit 4. Additionally, the wall thickness of conduit 4 should be selected to take a wear rate of at least 0.1 mm per year into account. This wearing is caused by the oscillation of third layer's 24 molecules. For steel, the wall thickness should be at least 3 mm. Obviously, softer materials need to be thicker. The conduit 4 may be of considerable length. In fact, it has been found that the performance efficiency of the conduit 4 increases with length.

Figure 3:
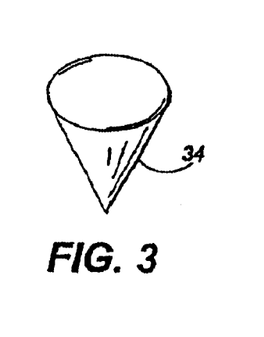
FIG. 3 is a perspective view of a plug used with the device of FIG. 1.

A representative superconducting heat transfer device 2 is manufactured utilizing the following steps:

(a) placing the first layer solution into a first layer solution container;

(b) submerging conduit 4 having cavity 8 within the first layer solution such that the first layer solution fills cavity 8, conduit 4 preferably having a non-horizontal placement with lower end 26 disposed in a downward direction within the first layer solution, at a temperature between 0° C. and 30° C. for at least 8 hours so that the first layer solution can penetrate the wall of conduit 4 to a depth of between 0.008 mm and 0.012 mm;

(c) drying conduit 4 naturally at ambient conditions to form first layer 20 within cavity 8;

(d) placing the second layer solution into a second layer solution container;

(e) submerging conduit 4 with first layer 20 within the second layer solution such that the second layer solution fills cavity 8, conduit 4 preferably having a non-horizontal placement with lower end 26 disposed in a downward direction within the second layer solution at a temperature between 55° C. and 65° C., preferably 60° C., for at least 4 hours;

(f) drying conduit 4 naturally at ambient conditions to form within cavity 8 a film of second layer 22 having a thickness between 0.008 mm and 0.012 mm;

(g) welding an end cap 28 on the opposite end of conduit 8 from lower end 26 by a precision welding technique, preferably heli-arc welding done in the presence of helium or argon;

(h) welding an injection cap 30 having a bore 32 with a diameter between 2.4 mm and 3.5 mm, preferably 3.0 mm, on lower end 26 preferably by the method utilized in step (g);

(i) heating lower end 26 to a temperature not to exceed 120° C., preferably to about 40° C.;

(j) injecting the powder of third layer 24 through bore 32 in an amount of at least 1 cubic meter per 400,000 cubic meters of cavity 8 volume;

(k) inserting plug 34, preferably conical-shaped and solid, as shown in FIG. 3, into bore 32;

(l) heating lower end 26 to a temperature between 80° C. and 125° C.;

(m) removing plug 34 from bore 32 for no more than about 3 seconds, preferably about 2 seconds, and reinserting plug 34 into bore 32; and (n) sealing plug 34 within bore 32, preferably by the welding method utilized in step (g), to form the superconducting heat transfer device 2.

If the temperature of lower end 26 in step (i) exceeds 60° C., lower end 26 should be allowed to cool to at least 60° C. prior to injecting the powder of third layer 24 into cavity 8. By following the steps above, lower end 26 becomes heat polarized. In other words, lower end 26 is polarized to receive heat from the heat source and transfer the heat away from lower end 26.

The purpose of removing plug 34 from bore 32 in step (m) above is to release air and water molecules from cavity 8 of conduit 4 to the outside environment. A blue gas has been observed exiting bore 32 once plug 34 is removed. However, if a blue light is observed emitting from bore 32 prior to plug 34 being reinserted into bore 32, the powder of third layer 24 has escaped to the atmosphere and steps (j) through (m) need to be repeated. If step (j) can be accomplished in a humidity free environment under a partial vacuum, steps (l) and (m) can be eliminated, but it is not recommended.

Manganese sesquioxide, rhodium oxide, and radium oxide are not needed in all applications of medium 6. These three components are used in medium 6 when the superconducting heat transfer device 2 is exposed to an environment of high pressure steam and conduit 4 is manufactured of high carbon steel. In this special case, high pressure is defined as being 0.92 million pascals or higher. Manganese sesquioxide, rhodium oxide, and radium oxide are not needed and may be eliminated from medium 6 when the use of the superconducting heat transfer device 2 is not in a high pressure steam environment, even if conduit 4 is made of high carbon steel. Additionally, when manganese sesquioxide, rhodium oxide, and radium oxide are eliminated from medium 6, the powder of third layer 24 should be provided in an amount of 1 cubic meter of third layer powder per 200,000 cubic meters of cavity 8 volume.

As disclosed above, heat sink 12 utilizes superconducting heat transfer medium 6. A representative heat sink 12 is manufactured utilizing the following steps:

(a) placing the first layer solution into a first layer solution container;

(b) submerging first plate 36 and second plate 38 within the first layer solution such that the first layer solution covers at least one side of each of first plate 36 and second plate 38 at a temperature between 0° C. and 30° C. for at least 8 hours so that the first layer solution can penetrate the first layer solution covered side 40 to a depth between 0.008 mm and 0.012 mm, first plate 36 and second plate 38 having mating edges 42 and form a relatively small volume cavity 8 with respect to the surface area of first plate 36 and second plate 38 when first plate 36 and second plate 38 are placed together, and at least one of first plate 36 and second plate 38 has an opening 44 between 2.4 mm and 3.5 mm, preferably 3.0 mm;

(c) drying first plate 36 and second plate 38 naturally at ambient conditions to form first layer 20 on the first layer covered sides 40 of first plate 36 and second plate 38;

(d) placing the second layer solution into a second layer solution container;

(e) submerging first plate 36 and second plate 38 within the second layer solution such that the second layer solution contacts first layer 20 at a temperature between 55° C. and 65° C., preferably 60° C., for at least 4 hours;

(f) drying first plate 36 and second plate 38 naturally at ambient conditions to form the film of second layer 22 having a thickness between 0.008 mm and 0.012 mm on first layer 20;

(g) welding first plate 36 and second plate 38 together along mating edges 42 by a precision welding technique, preferably heli-arc welding done in the presence of helium or argon, so that the first layer covered sides 40 face one another;

(h) injecting the powder of third layer 24 into cavity 8 through opening 44 in an amount of at least 1 cubic meter per 400,000 cubic meters of cavity volume; and (i) sealing opening 44 preferably by the method utilized in step (g) to form heat sink 12.

Heat sink 12 can be manufactured in the same manner as superconducting heat transfer device 2; that is, heat sink 12 may be heat polarized, but it is not necessary. Also, the steps calling for welding in the manufacture of superconducting heat transfer device 2 and heat sink 12 can be accomplished by using glues, adhesives and/or epoxies, preferably heat tolerant glues, adhesives and epoxies. Additionally, all welding should be conducted to a depth of two-thirds of the thickness of conduit 4, end cap 28, injection cap 30, first plate 36 or second plate 38. After welding, a leakage test, such as the Helium Vacuum Leakage Test, should be performed.

All materials comprising conduit 4, end cap 28, injection cap 30 and plug 34 of superconducting heat transfer device 2 or first plate 36 and second plate 38 of heat sink 12 should be compatible with one another. This prevents problems, particularly material fractures, associated with the different expansion/contraction rates of different materials used in combination and corrosion associated with anodic reactions. The material selected also should be compatible with and able to withstand the external environment in which superconducting heat transfer device 2 or heat sink 12 operates. For example, if superconducting heat transfer device 2 is operating in an acidic environment, the material should be resistant to the acid present.

The invention will be better understood by reference to the following illustrated examples. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those described in the specification are intended to be encompassed by the present invention.

The super conducting heat transfer medium 6 can also conduct cold temperature transfer when a cold source is exposed to either end of the conduit 4. Cold temperatures have been successfully transferred across the conduit 4 when one end thereof came in contact with liquid nitrogen having a temperature of −195 degrees C.

The following examples describe various compositions of first layer 20, second layer 22 and third layer 24 and are known to be useful in preparing superconducting heat transfer device 2 or heat sink 12. The components preferably are added to the respective layers 20, 22, 24 in the amounts listed, in the order of listing and in accordance with the respective steps described above.

EXAMPLE 1

For forming first layer 20, into 100 ml of distilled water add 5.0 grams of sodium peroxide, 0.5 gram of sodium oxide, 2.0 grams of magnesium dichromate or aluminum dichromate, 2.5 grams of calcium dichromate and 3.0 grams of boron oxide.

For forming second layer 22, into 100 ml of twice-distilled water add 0.5 gram of cobaltous oxide, 0.5 gram of manganese sesquioxide, 0.5 gram of strontium carbonate, 0.2 gram of rhodium oxide, 0.8 gram of cupric oxide, 0.6 gram of β-titanium and 1.2 gram of potassium dichromate.

For forming the powder of third layer 24, combine 1.75 grams of rhodium oxide, 1.25 gram of titanium, 3.1 grams of radium oxide, 2.6 gram of sodium dichromate, 0.4 gram of silver dichromate and 0.9 gram of monocrystalline silicon powder.

EXAMPLE 2

For forming first layer 20, into 100 ml of distilled water add 5.0 gram of sodium peroxide, 0.5 gram of beryllium oxide, 2.0 grams of magnesium dichromate, 2.0 grams of calcium dichromate and 3.0 grams of boron oxide.

For forming second layer 22, into 100 ml of twice-distilled water add 0.5 gram of cobaltous oxide, 0.5 gram of strontium chromate, 0.8 gram of cupric oxide, 0.6 gram of β-titanium and 1.2 gram of potassium dichromate.

For forming the powder of third layer 24, combine 1.6 grams of sodium dichromate, 0.8 gram of potassium dichromate, 0.4 gram of silver dichromate and 0.9 gram of monocrystalline silicon powder.

EXAMPLE 3

For forming first layer 20, into 100 ml of distilled water add 5.0 grams of sodium peroxide, 0.5 gram of beryllium oxide, 2.0 grams of magnesium dichromate, 3.5 grams of calcium dichromate and 3.0 grams of boron oxide.

For forming second layer 22, into 100 ml of twice-distilled water add 0.5 gram of cobaltous oxide, 0.5 gram of strontium chromate, 0.8 gram of cupric oxide, 0.6 gram of β-titanium and 1.2 grams of potassium dichromate.

For forming the powder of third layer 24, combine 1.6 grams of sodium dichromate, 0.8 gram of potassium dichromate, 0.6 gram of silver dichromate and 0.9 gram of monocrystalline silicon powder.

EXAMPLE 4

For forming first layer 20, into 100 ml of distilled water add 2.0 grams of sodium peroxide, 0.3 gram of beryllium oxide, 2.0 grams of magnesium dichromate, and 1.0 gram of boron oxide.

For forming second layer 22, into 100 mm of twice-distilled water add 0.5 gram of cobaltous oxide, 0.5 gram of strontium chromate, 0.4 gram of β-titanium and 1.0 gram of potassium dichromate.

For forming the powder of third layer 24, combine 0.5 gram of sodium dichromate, 0.8 gram of potassium dichromate, 0.1 gram of silver dichromate, 0.3 gram of monocrystalline silicon powder, 0.01 gram of beryllium oxide, 0.1 gram of strontium chromate, 0.1 gram of boron oxide and 0.1 gram of sodium peroxide.

EXAMPLE 5

For forming first layer 20, into 100 ml of distilled water add 2.0 grams of sodium peroxide, 0.3 gram of beryllium oxide, 2.0 grams of magnesium dichromate and 1.0 gram of boron oxide.

For forming second layer 22, into 100 ml of twice-distilled water add 0.3 gram of cobaltous oxide, 0.3 gram of strontium chromate, 1.0 gram of potassium dichromate and 1.0 gram of calcium dichromate.

For forming the powder of third layer 24, combine 0.3 gram of sodium dichromate, 0.1 gram of silver dichromate, 0.8 gram of potassium dichromate, 0–2 gram of monocrystalline silicon powder, 0.01 gram of beryllium oxide, 0.1 gram of strontium chromate, 0.1 gram of boron oxide, 0.2 gram of β-titanium and 0.1 gram of sodium peroxide.

EXAMPLE 6

For forming first layer 20, into 100 ml of distilled water add 2.0 grams of sodium peroxide, 0.3 gram of magnesium dichromate, 1.0 gram of boron oxide and 1.0 gram of calcium dichromate.

For forming second layer 22, into 100 ml of twice-distilled water add 0.3 gram of cobaltous oxide, 0.01 gram of beryllium oxide, 1.0 gram of potassium dichromate, 1.0 gram of boron oxide and 2.0 grams of magnesium dichromate.

For forming the powder of third layer 24, combine 0.3 gram of sodium dichromate, 0.1 gram of silver dichromate, 0.8 gram of potassium dichromate, 0.2 gram of monocrystalline silicon powder, 0.1 gram of strontium chromate, 0.01 gram of beryllium oxide, 0.1 gram of boron oxide, 0.1 gram of sodium peroxide, 0.2 gram of β-titanium and 0.2 gram of magnesium dichromate.

EXAMPLE 7

For forming first layer, into 100 ml of distilled water add 2.0 grams of sodium peroxide, 0.3 gram of magnesium dichromate and 1.0 gram of boron oxide.

For forming second layer 22, into 100 ml of twice-distilled water add 0.2 gram of cobaltous oxide, 1.0 gram of calcium dichromate, 1.0 gram of potassium dichromate, 0.5 gram of boron oxide, 1.0 gram of magnesium dichromate and 0.01 gram of beryllium oxide.

For forming the powder of third layer 24, combine 0.3 gram of sodium dichromate, 0.05 gram of silver dichromate, 0.8 gram of potassium dichromate, 0.2 gram of monocrystalline silicon powder, 0.1 gram of strontium chromate, 0.01 gram of beryllium oxide, 0.1 gram of boron oxide, 0.1 gram of sodium peroxide, 0.2 gram of β-titanium and 0.2 gram of magnesium dichromate.

Experimental

1. Introduction

Adding an appropriate quantity, on the order of several milligrams, of third layer 24 powder, which is an inorganic thermal superconductive medium to pipe, such as conduit 4, or flat interlayed piece, such as plates 36, 38, creates a superconductive device 2. For example, the addition of the third layer 24 powder into the cavity 6 of the conduit 6 or between the plates 36, 38 and then sealing the cavity 6 after subsequently eliminating the residual water and air upon heating, will create a thermal superconductive device 2. Subsequent test results prove that third layer 24 is a superconductive medium and that a heat conducting device made of third layer 24 is a thermal superconductive heat pipe.

The fact that a conventional heat pipe shares a similar outside shape to a thermal superconductive heat pipe used to raise some misunderstandings. Therefore, it is necessary to give a brief description on the differences and similarities of the two. A convectional heat pipe makes use of the technique of liquids vaporizing upon absorbing great amounts of heat and vapors cooling upon emitting heat so as to bring the heat from the pipe's hot end to its cold end. The axial heat conducting velocity of the heat pipe depends on the value of the liquids vaporization potent heat and the circulation speed between two forms of liquid and vapor. The axial heat conducting velocity of the heat pipe also is restrained by the type and quantity of the carrier material and the temperatures and pressures at which the heat pipe operates (it can not be too high). The present superconductive heat transfer device 2 is made of a thermal superconductive medium whose axial heat conduction is accomplished by the thermal superconductive mediums' molecules high speed movement upon being heated and activated. The present superconductive heat transfer device's 2 heat conducting velocity is much higher than that of any metal bars or any convectional heat pipes of similar size, while its internal pressure is much lower than that of any convectional heat pipe of the same temperature. The applicable upper temperature limit of the present superconductive thermal heat transfer device 2 is beyond the allowed upper temperature limit of the conduit 4 material.

The present superconductive thermal heat transfer device 2 can influence most if not all categories of heat transfer, especially on the heat utilization ratio. The present superconductive thermal heat transfer device 2 also is applicable in the development and utilization of solar energy and geothermal energy, and for the recycling of lower energy level heat.

2. Testing Method And Principle

The heat conducting velocity of a metal bar depends on the bar's heat conductivity, temperature gradient and the cross-sectional area orthogonal to the temperature gradient. Metals have higher heat conductivities than nonmetal solids. Among metals, silver has the highest heat conductivity of about 415 W/mK.

The present thermal superconductive heat transfer devices 2 are an entirely new development and there is no precedent an how to exemplify and test their properties. It would appear that using the measurements of their effective or apparent heat conductivities and axial and radial heat fluxes as an indication of their properties is scientific and logical. However, this does not change the fact that no precedent is available on the measuring methods of heat conductivities of thermal superconductive devices.

The testing method used to test the properties of the present superconductive thermal heat transfer devices 2 employed an upgrade Forbes Method, in which a thermal superconductive heat pipe was taken to be a semi-infinite rod. Given that the temperature of the rod's reference surface is $T_o$ K, the temperature of a cross-section x meters away from the reference surface is T K, the temperature of the fluid (water) which is adjacent to the rod surface and which undergoes heat convection between itself and the rod is $T_t$ K, the heat conductivity of the rod is k W/mK, the convectional heat transfer coefficient of the surface is h W/m²K, the girth of the rod is P meters, and the cross-sectional area of the rod is f m², the principal differential equation of heat transfer is $$d^2T/dx^2 - (h \cdot p)/(k \cdot f) \cdot (T - T_\infty) = 0 \tag{1}$$

This is a heterogeneous differential equation. Suppose $\theta = T - T_\infty$ and Equation (1) then transforms into a homogeneous equation, by assuming $m^2 = hp/kf$, we have $$d^2\theta/dx^2 - m^2\theta = 0 \tag{2}$$

For cylindrical objects, $m^2 = 4h/(kd_o)$, where $d_o$ is the diameter of the cylindrical object.

Suppose $\theta = \theta_0$ at $x = 0$ \hfill (3)

$\theta = 0$ at $x = \infty$ \hfill (4)

The solution that satisfies the above boundary conditions is $$\theta = \theta_0^{(-mx)}$$

Under the boundary conduction defined by Equations (6) and (7)

$\theta = \theta_0$ at $x = 0$ \hfill (6)

$d\theta/dx = 0$ at $x = L$ \hfill (7)

then another solution of Equation (2) is $$\theta/\theta_0 = \text{Exp}(mx)\{[1 + \text{Exp}(2m(L-x))]/[1 + \text{Exp}(2mL)]\} \tag{8}$$

Since some experimental conditions may appear similar to that specified by Equations (6) and (7), and the value of the expression inside the { } is close to 1, therefore we have $$\theta/\theta_0 -= \text{Exp}(mx) \tag{9}$$

which also is correct.

The axial heat conducting velocity across the reference surface is $$Q_x = -kf(d\theta/dx)_{x=0} \tag{10}$$

From Equation (5), we can deduce the following $$(d\theta/dx)_{x=0} = -\theta_0 m \text{Exp}(-mx)|_{x=0} = -\theta_0 m$$

By substitution with Equation (6), we have $$Q_0 = k \cdot f m \cdot \theta_0 \tag{12}$$

The speed of heat flux from rod to water is $$Q_0 = V \cdot p \cdot C_p \cdot (T_o - T_i) \text{ watts} \tag{13}$$

where V = volume flow rate of water (m³/s)
p = density of water (kg/m³)
$C_p$ = specific heat of water (J/kgK)
$T_o$ = outlet temperature of water (K)
$T_i$ = inlet temperature of water (K)

$$Q_r = d_o \pi L h)t_{ln} \tag{14}$$

where L = length of the rod (meters)
$d_o$ = outer diameter of the rod (meters)
h = convectional heat transfer coefficient (W/m²K)
$)t_{ln} = (\theta_o - \theta_L)/\ln(\theta_o/\theta_L)$ Upon having measured the above quantities, the effective heat conductivity of a thermal superconductive heat pipe can be calculated and the heat flux also can be calculated.

3. Testing Apparatus

Figure 7:
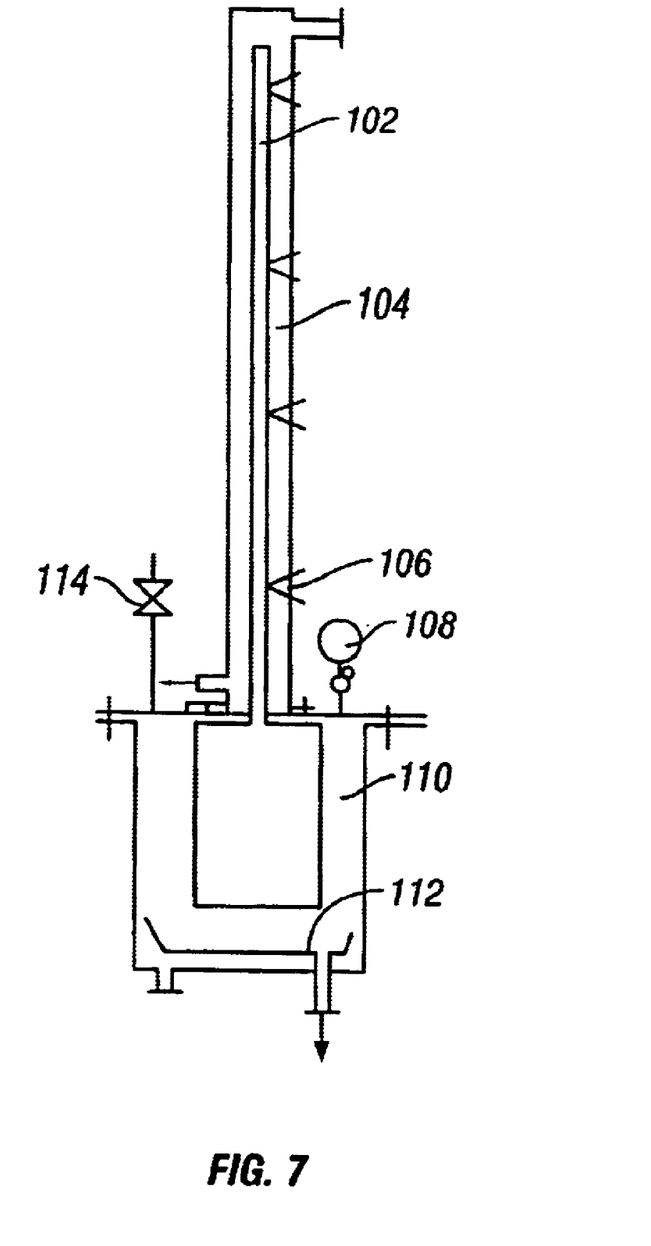
FIG. 7 is an example testing apparatus for testing the superconducting heat transfer device.
Figure 8:
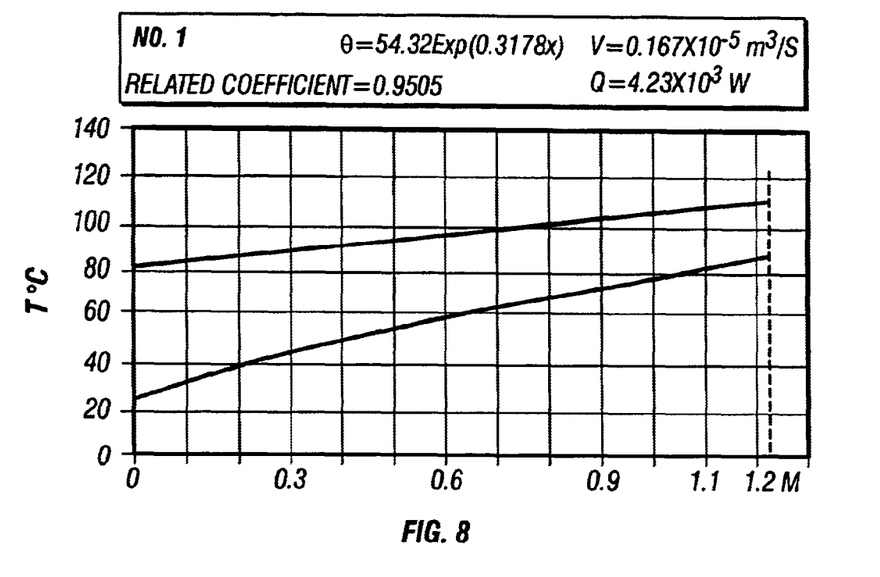
FIG. 8 is the data from the results of Test No. 1 on a preferred embodiment of the present invention.
Figure 9:
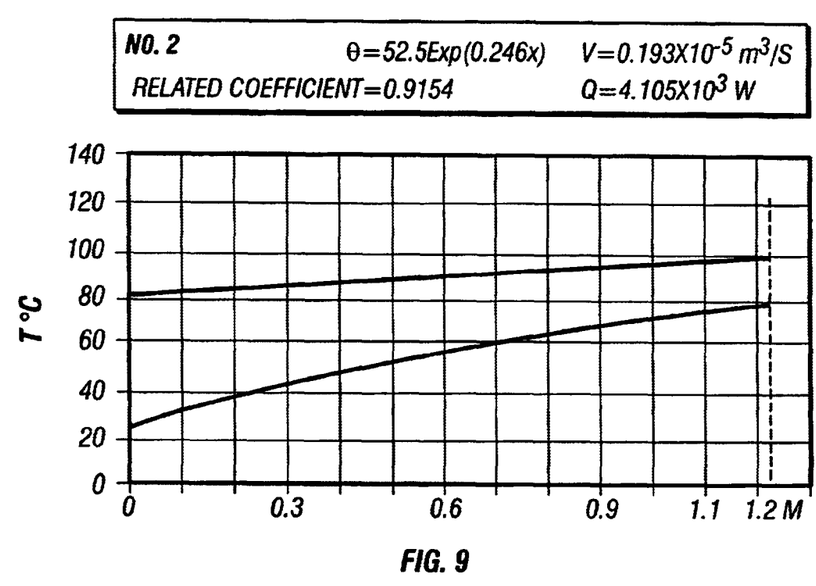
FIG. 9 is the data from the results of Test No. 2 on a preferred embodiment of the present invention.
Figure 10:
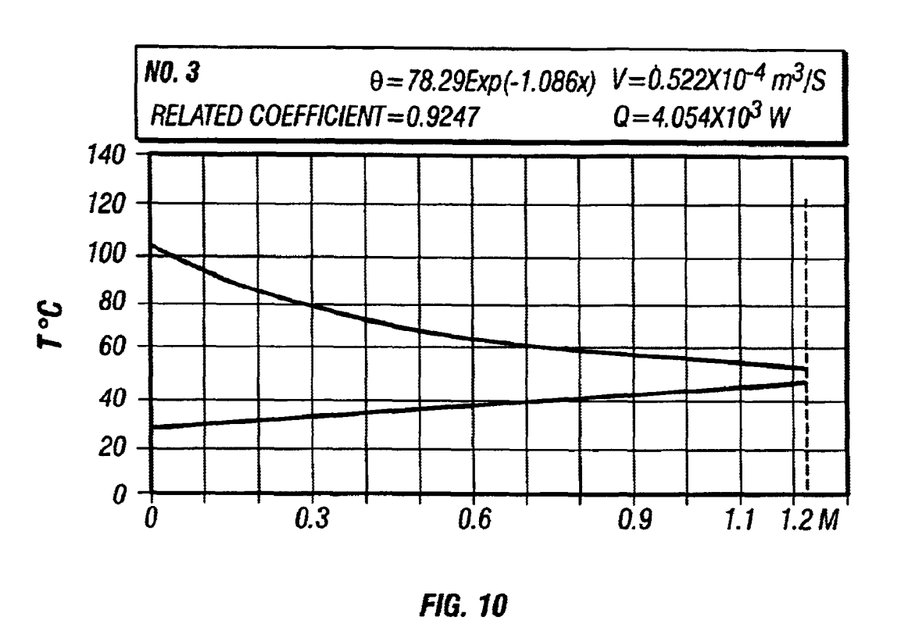
FIG. 10 is the data from the results of Test No. 3 on a preferred embodiment of the present invention.
Figure 11:
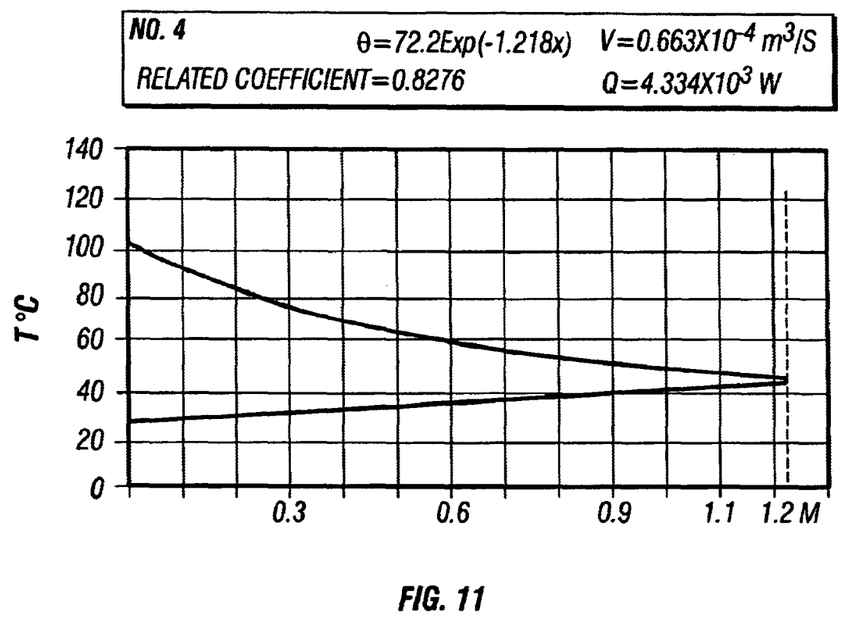
FIG. 11 is the data from the results of Test No. 4 on a preferred embodiment of the present invention.

Based on the above mentioned testing principle and mathematical model, a testing apparatus, as shown in FIG. 7, comprising the thermal heat conductive pipe 102, cooling water casing pipe 104, thermocouples 106, pressure gauge 108, water vapor heating chamber 110, condensed water collector 112, and evacuation valve 114 was assembled.

4. Testing Results

There are many advantages using saturated water vapor as the heat source to activate the thermal superconductive medium 24 inside the device 2. Saturated water vapor has a higher condensing heat transfer coefficient and the saturated water vapor comes into direct contact with the heated surface of the device 2 exclusive of contact heat resistance. Keeping the pressure of the saturated water vapor under control means keeping the heating temperature under control, and can provide the thermal superconductive heat transfer device 2 with a stable heat flux. After the flow rate and the inlet temperature of the cooling water is specified, the testing system will come into a stable equilibrium. All of the physical quantities that are measured are stable and well repeatable.

The following chart illustrates four representative groups of measured results, and FIGS. 8–11 show these results graphically.

| | Results of Measurement | | | |
|---|---|---|---|---|
| No. | Axial Heat Flux (W/m) | Radial Heat Flux (W/m) | Effective Heat Conductivity (W/mK) | k/kAg |
| 1 | 8.618 × 10⁶ | 4.396 × 10⁴ | 1.969 × 10⁶ | 4.746 × 10³ |
| 2 | 8.363 × 10⁶ | 4.267 × 10⁴ | 3.183 × 10⁶ | 7.672 × 10³ |
| 3 | 8.260 × 10⁶ | 4.214 × 10⁴ | 2.624 × 10⁵ | 6.324 × 10² |
| 4 | 8.831 × 10⁶ | 4.505 × 10⁴ | 3.235 × 10⁴ | 7.795 × 10² |

The temperature distribution curve, effective heat conductivity, convectional heat transfer coefficient of the pipe surface of the cooling segment, and heat conducting velocity were obtained under different cooling water flow rates. Although these values show certain differences, they indicate that the heat pipe is thermally superconductive.

Changes of cooling water flow rates causes changes in temperature distribution, but no changes in heat conducting velocity. This means that the heat conducting velocity in the heating segment has reached its upper limit. That the heat conducting area of the heating segment was designed not great enough was due to the underestimation of the heat conducting capability of the heat pipe. Changes in temperature distribution brought changes in the value and sign of slope m in the correlation equation. That the convectional heat transfer coefficient was changed means that the effective heat conductivity also was changed. The thermal, superconductivity of the heat pipe is confirmed by these changes. When m has a plus sign, the outlet temperature of the cooling water approaches the temperature at the base of the heat pipe (at x=0). A conventional heat exchanger can attain such a high heat transfer efficiency only under the condition of counter flow. If the cooling water flow rate is increased, then the outlet temperature of the cooling water approaches that at the other end (x=L). A conventional heat exchanger can reach such a great heat transfer efficiency only when the heat conducting area is infinite.

Therefore, the foregoing, including the examples, is considered as illustrative only of the principles of the invention. Further, various modifications may be made of the invention without departing from the scope and spirit thereof and it is desired, therefore, that only such limitations shall be placed thereon as are imposed by the prior art and which are set forth in the appended claims.

I claim as my invention:

1. A heat transfer structure comprising a substrate having a surface thereon and a heat conducting medium on the surface, the medium having a thermal conductivity substantially greater than silver.

2. The heat transfer structure of claim 1 wherein the medium comprises sodium chromate, silver dichromate, and monocrystalline silicon.

3. The heat transfer structure of claim 2 wherein said silver dichromate and said monocrystalline silicon have been treated by a step of magnetic resonating.

4. The heat transfer structure of claim 3 wherein said monocrystalline silicon is powder during said magnetic resonating step.

5. The heat transfer structure of claim 2 wherein said monocrystalline silicon has a purity greater than 99.999%.

6. A beat transfer structure comprising a substrate having a surface thereon and a heat conducting medium on the surface, the medium having a thermal conductivity which substantially increases above an activation temperature.

7. The heat transfer structure of claim 6 wherein the medium comprises sodium chromate, silver dichromate, and monocrystalline silicon.

8. The heat transfer structure of claim 7 wherein said silver dichromate and said monocrystalline silicon have been treated by a step of magnetic resonating.

9. The heat transfer structure of claim 8 wherein said monocrystalline silicon is powder during said magnetic resonating step.

10. The heat transfer structure of claim 7 wherein said monocrystalline silicon has a purity greater than 99.999%.

* * * * *